(12) United States Patent
Kwon et al.

(10) Patent No.: US 8,961,837 B2
(45) Date of Patent: Feb. 24, 2015

(54) PHOTOSENSITIVE RESIN COMPOSITION FOR COLOR FILTER AND COLOR FILTER USING SAME

(71) Applicant: Cheil Industries Inc., Gumi-si (KR)

(72) Inventors: Ji-Yun Kwon, Uiwang-si (KR); In-Jae Lee, Uiwang-si (KR); Ju-Ho Jung, Uiwang-si (KR); Dong-Wan Kim, Uiwang-si (KR); Jae-Hyun Kim, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/929,056

(22) Filed: Jun. 27, 2013

(65) Prior Publication Data

US 2013/0306918 A1    Nov. 21, 2013

Related U.S. Application Data

(63) Continuation-in-part of application No. PCT/KR2011/003144, filed on Apr. 28, 2011.

(30) Foreign Application Priority Data

Dec. 29, 2010    (KR) .................. 10-2010-0137876

(51) Int. Cl.
*G02B 5/23* (2006.01)
*G03F 7/00* (2006.01)
(Continued)

(52) U.S. Cl.
CPC .............. *G03F 7/0007* (2013.01); *G03F 7/027* (2013.01); *C09B 29/0003* (2013.01);
(Continued)

(58) Field of Classification Search
USPC .............. 252/586, 301.35; 257/440; 313/498; 349/106; 430/7, 270.1, 281.1; 525/99; 534/773

See application file for complete search history.

(56) References Cited

U.S. PATENT DOCUMENTS 3,950,321 A * 4/1976 Dehnert et al. ............... 534/756
5,112,362 A   5/1992 Hahn et al.
(Continued)

FOREIGN PATENT DOCUMENTS

CN    1643077 A    7/2005
CN    101018829 A    8/2007
(Continued)

OTHER PUBLICATIONS

International Search Report in counterpart International Application No. PCT/KR2011/003144 dated Jan. 18, 2012, pp. 1-2.
(Continued)

*Primary Examiner* — Bijan Ahvazi
(74) *Attorney, Agent, or Firm* — Additon, Higgins & Pendleton, P.A.

(57) ABSTRACT

Provided are a photosensitive resin composition for a color filter and a color filter using the same. The photosensitive resin composition for a color filter includes (A) a colorant including a diaminopyridine azo-based dye including a structure represented by Chemical Formula 1, and having an absorption wavelength at about 450 to about 550 nm, (B) an acrylic-based binder resin, (C) an acrylic-based photopolymerizable monomer, (D) a photopolymerization initiator, and (E) a solvent.

8 Claims, 2 Drawing Sheets

(51) Int. Cl.
*G03F 7/027* (2006.01)
*C09B 29/01* (2006.01)
*C09B 29/036* (2006.01)
*C09B 29/42* (2006.01)
*G03F 7/105* (2006.01)
*G03F 1/00* (2012.01)
*G03C 1/00* (2006.01)
*G02B 5/20* (2006.01)
*G03F 7/031* (2006.01)

(52) U.S. Cl.
CPC ........ *C09B 29/0007* (2013.01); *C09B 29/0048* (2013.01); *C09B 29/3621* (2013.01); *G03F 7/105* (2013.01); *G02B 5/201* (2013.01); *G03F 7/031* (2013.01)
USPC .......... 252/586; 252/301.35; 349/106; 430/7; 430/270.1; 430/281.1

(56) References Cited

U.S. PATENT DOCUMENTS

| | | | |
|---|---|---|---|
| 5,403,363 | A | 4/1995 | Loeffler et al. |
| 6,033,813 | A | 3/2000 | Endo et al. |
| 6,733,935 | B2 | 5/2004 | Kishimoto et al. |
| 7,026,459 | B2 * | 4/2006 | Dreier et al. .................. 534/773 |
| 7,517,619 | B2 | 4/2009 | Hosaka et al. |
| 7,713,343 | B2 | 5/2010 | Goto et al. |
| 2005/0175908 | A1 | 8/2005 | Seto et al. |
| 2008/0010756 | A1 * | 1/2008 | Hall-Goulle et al. .......... 8/637.1 |
| 2008/0179572 | A1 * | 7/2008 | Kim et al. .................... 252/586 |
| 2010/0163811 | A1 | 7/2010 | Oh et al. |

FOREIGN PATENT DOCUMENTS

| | | |
|---|---|---|
| CN | 101216670 A | 7/2008 |
| JP | 03-172354 | 7/1991 |
| JP | 06-041458 | 2/1994 |
| JP | 06-067467 A | 3/1994 |
| JP | 07-140654 | 6/1995 |
| JP | 10-254133 | 9/1998 |
| JP | 2004-107354 A | 4/2004 |
| JP | 2007-217531 A | 8/2007 |
| JP | 2008-106130 A | 5/2008 |
| JP | 2009-162802 A | 7/2009 |
| KR | 1999-0007097 | 1/1999 |
| KR | 10-1999-0072717 A | 9/1999 |
| KR | 10-2002-0015650 A | 2/2002 |
| KR | 10-0635834 | 12/2003 |
| KR | 10-2004-0097192 A | 11/2004 |
| KR | 10-2005-0020653 A | 3/2005 |
| KR | 10-2005-0028883 A | 3/2005 |
| KR | 10-2009-0106226 A | 10/2009 |
| KR | 10-2010-0078845 A | 7/2010 |
| KR | 10-2010-0080142 A | 7/2010 |
| KR | 10-2010-0080318 A | 7/2010 |
| KR | 10-2010-0128707 A | 12/2010 |
| WO | 2006/024618 A1 | 3/2006 |
| WO | 2012/091224 A1 | 7/2012 |

OTHER PUBLICATIONS

Search Report issued in counterpart Taiwanese Application No. 10115806 dated Dec. 20, 2013, pp. 1.
English-translation of Search Report issued in counterpart Taiwanese Application No. 10115806 dated Dec. 20, 2013, pp. 1.

* cited by examiner

PHOTOSENSITIVE RESIN COMPOSITION FOR COLOR FILTER AND COLOR FILTER USING SAME

CROSS-REFERENCE TO RELATED APPLICATIONS

This application is a continuation-in-part of International Application No. PCT/KR2011/003144, filed Apr. 28, 2011, pending, which designates the U.S., published as WO 2012/091224, and is incorporated herein by reference in its entirety, and claims priority therefrom under 35 USC Section 120. This application also claims priority under 35 USC Section 119 from Korean Patent Application No. 10-2010-0137876, filed Dec. 29, 2010, the entire disclosure of which is also incorporated herein by reference.

FIELD

This disclosure relates to a photosensitive resin composition for a color filter and a color filter using the same.

BACKGROUND

A liquid crystal display (LCD) device is an example of display devices and has advantages of lightness, thinness, low cost, low power consumption, an excellent junction with an integrated circuit, and the like, and thus is widely used in laptops, monitors, and TV screens. The liquid crystal display device includes a lower substrate including a black matrix, a color filter, and an indium tin oxide (ITO) pixel electrode, and an upper substrate including an active circuit portion including a liquid crystal layer, a thin film transistor, an electricity storage capacitor layer, and an ITO pixel electrode. In the liquid crystal display device, color filters are formed in a pixel region by sequentially laminating a plurality of color filters (in general, formed of three primary colors such as red (R), green (G), and blue (B)) in a predetermined order to form each pixel, and a black matrix layer is disposed in a predetermined pattern on a transparent substrate to form a boundary between the pixels.

A color filter may be fabricated using a pigment dispersion method. According to the pigment dispersion method, a thin film is formed by repeatedly coating a photosensitive resin composition including an alkali soluble resin, a photopolymerization monomer, a photopolymerization initiator, an epoxy resin, a solvent, and other additives as well as a colorant on a transparent substrate provided with a black matrix, exposing a desired pattern to a light, removing an unexposed part with a solvent, and thermally curing the resulting product. This method is actively used to fabricate LCDs for mobile phones, laptops, monitors, TVs, and the like.

However, recently there is increased demand that a photosensitive resin composition for a color filter fabricated using a pigment dispersion method provide high luminance, a high contrast ratio, and the like as well as high color reproducibility and excellent pattern profiles.

A color filter fabricated using a conventional pigment-type photosensitive resin composition can have limited luminance and contrast ratio due to the size of pigment particles. Accordingly, when a photosensitive resin composition includes a highly durable dye with no particles or small primary particles in a predetermined amount or more instead of a pigment, excellent high luminance and high contrast ratio may be accomplished while maintaining the thickness of a conventional pixel compared with the pigment-type photosensitive resin composition. This has been illustrated in Korean Patent Laid-Open Publication No.'s 1999-0007097, 2002-0015650, 2005-0020653, 2008-0138780, and the like. However, a dye used in these arts may accomplish luminance characteristics but also can have poor durability due to a small particle size and molecular weight.

Therefore, there is a need for a new photosensitive resin composition for a color filter having excellent durability as well as high luminance and high contrast ratio.

SUMMARY

One embodiment of the present invention provides a photosensitive resin composition for a color filter, which can exhibit high luminance and a high contrast ratio in a desired color coordinate and simultaneously excellent light, heat, and chemical resistance, as well as durability.

Another embodiment of the present invention provides a color filter manufactured using the photosensitive resin composition for a color filter.

According to one embodiment of the present invention, a photosensitive resin composition for a color filter is provided that includes: (A) a colorant including a diaminopyridine azo-based dye having a structure represented by the following Chemical Formula 1 and having an absorption wavelength in a range of about 450 to about 550 nm; (B) an acrylic-based binder resin; (C) an acrylic-based photopolymerizable monomer; (D) a photopolymerization initiator; and (E) a solvent.

[Chemical Formula 1]

In Chemical Formula 1, $R^1$ is substituted or unsubstituted C1 to C20 alkyl, C2 to C20 alkylamino, C1 to C20 alkylsulfonyl, or C1 to C20 alkyl wherein at least one —$CH_2$— is replaced with —$SO_2$—, —O—, or —NR— (wherein R is hydrogen or C1 to C6 alkyl), $R^2$ is substituted or unsubstituted C6 to C30 arylene or substituted or unsubstituted C6 to C30 heteroarylene, $R^3$, $R^4$, $R^5$, $R'^4$, and $R'^5$ are the same or different and are each independently hydrogen, substituted or unsubstituted C1 to C20 alkyl, C1 to C20 alkyl wherein at least one —$CH_2$— is replaced with —$SO_2$—, —O—, or —NR— (wherein R is hydrogen or C1 to C6 alkyl), substituted or unsubstituted C3 to C20 cycloalkyl, substituted or unsubstituted C2 to C20 alkenyl, substituted or unsubstituted C6 to C30 aryl, substituted or unsubstituted C2 to C30 heterocyclic group, sulfonyl alkyl (—$SO_2R'$, wherein R' is hydrogen or C1 to C10 alkyl), sulfonyl aryl (—$SO_2R''$, wherein R'' is C6 to C16 aryl), an acylic group, a carboxyl group, a sulfone group, or a carbamoyl group, and $R^6$ is hydrogen, halogen, or cyano.

The photosensitive resin composition may include about 1 to about 30 wt % of the colorant (A), about 1 to about 30 wt % of the acrylic-based binder resin (B), about 1 to about 20 wt % of the acrylic-based photopolymerizable monomer (C), about 0.1 to about 10 wt % of the photopolymerization initiator (D), and a balance amount of the solvent (E).

The dye may have solubility of about 5 to about 15 in a solvent.

The dye may have a transmittance of about 95 to about 100% in a long wavelength region ranging from about 500 to about 800 nm.

The dye may have a thermal decomposition temperature ($Td_{10\%}$) ranging from about 280 to about 400° C. at which about 10 wt % of the dye is thermally decomposed.

The dye may have ΔEab* of less than about 3.

The photosensitive resin composition may further include a pigment and the diaminopyridine azo-based dye represented by the above Chemical Formula 1 in a mixing weight ratio ranging from about 7:3 to about 3:7.

The photosensitive resin composition may further include an additive such as a dispersing agent; malonic acid; 3-amino-1,2-propanediol; a silane-based coupling agent including a vinyl group or a (meth)acryloxy group; a leveling agent; a fluorine-based surfactant; a radical polymerization initiator; or a mixture thereof.

According to another embodiment of the present invention, a color filter manufactured using the photosensitive resin composition for a color filter is provided.

Hereinafter, other embodiments of the present invention will be described in detail.

The photosensitive resin composition for a color filter can have excellent luminance characteristics, excellent light, heat, and chemical resistance, and excellent durability. Accordingly, when it is used in the manufacture of a color filter for an LCD and an LED, excellent luminance and contrast ratio may be accomplished.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" may refer to C1 to C20 alkyl, the term "cycloalkyl" may refer to C3 to C20 cycloalkyl, the term "alkenyl" may refer to C2 to C20 alkenyl, the term "aryl" may refer to C6 to C30 aryl, and the term "arylene" may refer to C6 to C30 arylene.

As used herein, when a specific definition is not otherwise provided, the term "substituted" may refer to one substituted with a substituent including halogen (F, Cl, Br, or I), a hydroxy group, a cyano group, an imino group (=NH, =NR, wherein R is C1 to C10 alkyl), an amino group (—$NH_2$, —NH(R'), —N(R")(R'"), wherein R' to R'" are the same or different and are each independently C1 to C10 alkyl), an amidino group, a hydrazine or hydrazone group, a carboxyl group, substituted or unsubstituted C1 to C20 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof, instead of at least one hydrogen in a functional group.

As used herein, when a specific definition is not otherwise provided, the term "hetero" may refer to one including at least one heteroatom including N, O, S, P, or a combination thereof in place of a hydrogen atom of a cyclic group.

As used herein, when a specific definition is not otherwise provided, the term "heteroaryl" may refer to C2 to C30 heteroaryl including at least one heteroatom in an aryl ring, the term "heteroarylene" may refer to C2 to C30 heteroarylene including at least one heteroatom in arylene ring, the term "heterocycloalkyl" may refer to C2 to C30 heterocycloalkyl including at least one heteroatom in a cycloalkyl ring, and the term "heterocyclic group" may refer to the forgoing heteroaryl and heterocycloalkyl.

The photosensitive resin composition for a color filter according to one embodiment of the present invention includes (A) a colorant including a diaminopyridine azo-based dye having a structure represented by the following Chemical Formula 1 and showing an absorption wavelength at about 450 to about 550 nm, (B) an acrylic-based binder resin, (C) an acrylic-based photopolymerizable monomer, (D) a photopolymerization initiator, and (E) a solvent.

[Chemical Formula 1]

In Chemical Formula 1, $R^1$ is substituted or unsubstituted C1 to C20 alkyl, C2 to C20 alkylamino, C1 to C20 alkylsulfonyl, or C1 to C20 alkyl wherein at least one —$CH_2$— is replaced with —$SO_2$—, —O—, or —NR— (wherein R is hydrogen or C1 to C6 alkyl), $R^2$ is substituted or unsubstituted C6 to C30 arylene or substituted or unsubstituted C6 to C30 heteroarylene, $R^3$, $R^4$, $R^5$, $R'^4$, and $R'^5$ are the same or different and are each independently hydrogen, substituted or unsubstituted C1 to C20 alkyl, C1 to C20 alkyl wherein at least one —$CH_2$— is replaced with —$SO_2$—, —O—, or —NR— (wherein R is hydrogen or C1 to C6 alkyl), substituted or unsubstituted C3 to C20 cycloalkyl, substituted or unsubstituted C2 to C20 alkenyl, substituted or unsubstituted C6 to C30 aryl, substituted or unsubstituted C2 to C30 heterocyclic group, sulfonyl alkyl (—$SO_2R'$, wherein R' is hydrogen or C1 to C10 alkyl), sulfonyl aryl (—$SO_2R''$, wherein R" is C6 to C16 aryl), an acylic group, a carboxyl group, a sulfone group, or a carbamoyl group, and $R^6$ is hydrogen, halogen or cyano. As used herein, the term halogen refers to F, Cl, Br, I, and the like.

The photosensitive resin composition for a color filter according to one embodiment may further include (F) a pigment and (G) one or more other additives.

The photosensitive resin composition for a color filter includes a diaminopyridine azo-based dye to provide colors of a color filter having appropriate spectrum characteristic under a color coordinate condition according to sRGB (standard Red Green Blue), NTSC (National Television System Committee), and EBU (European Broadcasting Union) criteria, and simultaneously can have high luminance in a desired color coordinate, and excellent light resistance, heat resistance, chemical resistance, and durability. Accordingly, when used in the manufacture of a color filter for an LCD and an LED, the photosensitive resin composition may provide high luminance and high contrast ratio as well as excellent light resistance, heat resistance, chemical resistance, and durability.

Hereinafter, each component of the photosensitive resin composition for a color filter according to one embodiment is described.

(A) Colorant

The colorant includes a diaminopyridine azo-based dye having a structure represented by the following Chemical Formula 1 and having an absorption wavelength at about 450 to about 550 nm.

[Chemical Formula 1]

In Chemical Formula 1, $R^1$ is substituted or unsubstituted C1 to C20 alkyl, C2 to C20 alkylamino alkylsulfonyl, or C1 to C20 alkyl wherein at least one —CH$_2$— is replaced with —SO$_2$—, —O—, or —NR— (wherein R is hydrogen or C1 to C6 alkyl), $R^2$ is substituted or unsubstituted C6 to C30 arylene or substituted or unsubstituted C6 to C30 heteroarylene, $R^3$, $R^4$, $R^5$, $R'^4$, and $R'^5$ are the same or different and are each independently hydrogen, substituted or unsubstituted C1 to C20 alkyl, C1 to C20 alkyl wherein at least one —CH$_2$— is replaced with —SO$_2$—, —O— or —NR— (wherein R is hydrogen or C1 to C6 alkyl), substituted or unsubstituted C3 to C20 cycloalkyl, substituted or unsubstituted C2 to C20 alkenyl, substituted or unsubstituted C6 to C30 aryl, substituted or unsubstituted C2 to C30 heterocyclic group, sulfonyl alkyl (—SO$_2$R', wherein R' is hydrogen or C1 to C10 alkyl), sulfonyl aryl (—SO$_2$R", wherein R" is C6 to C16 aryl), an acylic group, a carboxyl group, a sulfone group, or a carbamoyl group, and $R^6$ is hydrogen, halogen, or cyano.

In general, a color filter prepared by using a pigment-type photosensitive resin composition may have a limit in luminance and contrast ratio due to the particle size of a pigment. Accordingly, a colorant such as a dye, a pigment, and the like for a color filter may have solubility of about 5 g/100 g solvent or more in a solvent used to prepare a photosensitive resin composition for a color filter in order to secure compatibility with other composition components and coloring capability and to simultaneously prevent precipitation of the colorant.

The present invention provides a photosensitive resin composition for a color filter including a diaminopyridine azo-based dye which can have no or minimial particles and/or a smaller primary particle diameter than a pigment dispersion in order to provide a color filter that can have excellent luminance and contrast ratio. In particular, the diaminopyridine azo-based dye may have solubility of about 5 g/100 g solvent or more, for example about 5 to about 15 g/100 g solvent, in a solvent used for a common photosensitive resin composition such as propylene glycol monomethylether acetate (PG-MEA), propylene glycol methyl ether (PGME), and/or cyclohexanone (Anon). Accordingly, the dye may prevent deterioration of contrast ratio when the photosensitive resin composition is used to fabricate a color filter and thus can improve compatibility with other compounds therein.

In addition, a colorant such as a dye or a pigment has an inherent luminance characteristic. The colorant can exhibit a change in luminance due to a substituent even in the same structure, and thus the luminance of the colorant can be selective, or vary, depending on its structure. In addition, a dispersed dye prepared using a heterocyclic compound with a diazo component or a coupling component may realize a deep and clear color. According to the present invention, a diaminopyridine azo-based dye includes two amino groups in the diaminopyridine azo central backbone and thus can have excellent coloring capability as well as provide a clear color.

In addition, the diaminopyridine azo-based dye of the present invention may control the chemical structure and stereo-planarity of a photosensitive resin composition, and thus can overcome reliability drawbacks of a conventional dye such as heat resistance and chemical resistances and the like, and thus can improve heat and chemical resistance. In exemplary embodiments, a diaminopyridine azo-based dye may have a thermal decomposition temperature (Td$_{10\%}$) ranging from about 280 to about 400° C., at which about 10 wt % of the dye is thermally decomposed, and ΔEab* of less than about 3, for example about 1.0<ΔEab*<about 3.0, which is a reliability index during a thermal process of a common color resist.

Furthermore, a color filter needs high transmittance in a predetermined region in order to realize high luminance. In general, a yellow colorant has a maximum absorption wavelength in a region ranging from about 400 to about 460 nm in terms of spectrum characteristic, and transmittance ranging from about 95 to about 100% in a region ranging from about 500 to about 800 nm. In contrast, a diaminopyridine azo-based dye according to one embodiment of the present invention can have a maximum absorption wavelength in a region expressing an orange-based color and in a region ranging from about 450 to about 550 nm and transmittance ranging from about 95 to about 100% in a long wavelength region ranging from about 500 to about 800 nm. Accordingly, the dye can be used to manufacture a color filter exhibiting high luminance.

The photosensitive resin composition for a color filter may further include a pigment having a color such as red, green, blue, yellow, and/or violet.

Examples of the pigment may include without limitation anthraquinone-based pigments, condensation polycyclic pigments such as perylene-based pigments and the like, phthalocyanine pigments, azo-based pigments, and the like. The pigments may be used as singularly or in combination of two or more. The combination of two or more pigments can help adjust maximum absorption wavelength, cross point, crosstalk, and the like.

According to one embodiment of the present invention, the diaminopyridine azo-based dye and the pigment may be mixed in a weight ratio ranging from about 3:7 to about 7:3 in order to improve luminance in a long wavelength region.

In some embodiments, the combination of the diaminopyridine azo-based dye and the pigment may include the diaminopyridine azo-based dye in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the diaminopyridine azo-based dye can be in a range from about any of the foregoing amounts to about any other of the foregoing amounts.

In some embodiments, the combination of the diaminopyridine azo-based dye and the pigment may include the pigment in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the pigment can be in a range from about any of the foregoing amounts to about any other of the foregoing amounts.

The pigment may be prepared as a pigment dispersion and included in the photosensitive resin composition for a color filter.

In addition, a dispersing agent may be used to uniformly disperse the pigment component. Examples of the dispersing agent may include without limitation nonionic, anionic, and/or cationic dispersing agents, for example, polyalkylene glycol and esters thereof, polyoxyalkylene, polyhydric alcohol ester alkylene oxide addition products, alcohol alkylene oxide addition products, sulfonic acid esters, sulfonic acid salts, carboxylic acid esters, carboxylic acid salts, alkyl amide alkylene oxide additives, alkyl amines, and the like. These dispersing agents may be used singularly or in combination of two or more.

In addition, a carboxyl-containing acrylic-based resin as well as the dispersing agent may be added to the pigment in order to improve stability of a pigment dispersion and pattern of pixels.

The pigment can have a primary particle diameter ranging from about 10 to about 80 nm, for example about 10 to about 70 nm. When the pigment has a primary particle diameter within the above range, it can have excellent stability in a pigment dispersion and may not deteriorate resolution of pixels.

The photosensitive resin composition may include the colorant in an amount of about 1 to about 30 wt %, for example about 5 to about 20 wt % based on the total amount (weight) of the photosensitive resin composition. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of colorant can be in a range from about any of the foregoing amounts to about any other of the foregoing amounts.

When the colorant is used in an amount within the above range, luminance and contrast ratio may be improved.

(B) Acrylic-Based Binder Resin

In one embodiment of the present invention, the acrylic-based binder resin is a copolymer of a first ethylenic unsaturated monomer including at least one carboxyl group and a second ethylenic unsaturated monomer that is copolymerizable with the first ethylenic unsaturated monomer.

The first ethylenic unsaturated monomer is an ethylenic unsaturated monomer including more than one carboxyl group. Examples of the first ethylenic unsaturated monomer include, but are not limited to, acrylic acid, methacrylic acid, maleic acid, itaconic acid, fumaric acid, and the like, and combinations thereof.

The acrylic-based binder resin may include the first ethylenic unsaturated monomer in an amount of about 5 to about 50 wt %, for example about 10 to about 40 wt %, based on the total weight of the acrylic-based binder resin. In some embodiments, the acrylic-based binder resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

When the first ethylenic unsaturated monomer is included in an amount within the above range, suitable developability of a composition as well as heat and chemical resistance may be provided.

Examples of the second ethylenic unsaturated monomer include, but are not limited to, aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile, and the like; and unsaturated amide compounds such as (meth)acrylamide, and the like. These compounds may be respectively used singularly or in a mixture of two or more.

Examples of the acrylic-based binder resin include without imitation a methacrylic acid/methylmethacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, a methacrylic acid/benzyl methacrylate/styrene/2-hydroxy ethyl methacrylate copolymer, and the like, and combinations therefo.

The acrylic-based binder resin may have a weight average molecular weight ranging from about 3000 to about 150,000, for example about 5000 to about 50,000 g/mol. When the acrylic-based binder resin has a weight average molecular weight within the above range, developability of the photosensitive resin composition can be improved.

The acrylic-based binder resin may have an acid value of about 20 to about 200 mgKOH/g, for example about 50 to about 160 mgKOH/g. When the acrylic-based binder resin has an acid value within the above range, developability of the photosensitive resin composition can be improved.

The photosensitive resin composition may include the acrylic-based binder resin in an amount of about 1 to about 30 wt %, for example about 3 to about 30 wt %, based on the total amount (weight) of the photosensitive resin composition. In some embodiments, the photosensitive resin composition may include the acrylic-based binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of acrylic-based binder resin can be in a range from about any of the foregoing amounts to about any other of the foregoing amounts.

When the acrylic-based binder resin is included in an amount within the above range, the composition may have excellent developability in an alkali development solution and good cross-linking, and thus less surface roughness, and in addition, excellent chemical resistance, and thus no pattern peeling.

(C) Acrylic-Based Photopolymerizable Monomer

Examples of the acrylic-based photopolymerizable monomer in one embodiment may include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol A diacrylate, trimethylolpropane triacrylate, novolacepoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and combinations thereof.

The photosensitive resin composition may include the acrylic-based photopolymerizable monomer in an amount of about 1 to about 20 wt % based on the total weight of the photosensitive resin composition for a color filter. In some embodiments, the photosensitive resin composition may include the acrylic-based photopolymerizable monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of acrylic-based photopolymerizable monomer can be in a range from about any of the foregoing amounts to about any other of the foregoing amounts.

When the photosensitive resin composition includes the acrylic-based photopolymerizable monomer in an amount within the above range, the composition may form a pattern having a clear edge and can have excellent development with an alkali development solution.

(D) Photopolymerization Initiator

Examples of the photopolymerization initiator in one embodiment of the present invention may include without limitation triazine-based compounds, acetophenone-based compounds, benzophenone-based compounds, thioxanthone-based compounds, benzoin-based compounds, oxime-based compounds, and the like, and combinations thereof.

Examples of the triazine-based compound may include without limitation 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis (trichloro methyl)-s-triazine, 2-biphenyl-4,6-bis(trichloro methyl)-s-triazine, bis(trichloro methyl)-6-styryl-s-triazine, 2-(naphtho-1-yl)-4,6-bis(trichloro methyl)-s-triazine, 2-(4-methoxy naphtho-1-yl)-4,6-bis(trichloro methyl)-s-triazine, 2,4-trichloro methyl(piperonyl)-6-triazine, 2,4-(trichloro methyl (4'-methoxy styryl)-6-triazine, and the like, and combinations thereof.

Examples of the acetophenone-based compound may include without limitation 2,2'-diethoxy acetophenone, 2,2'-dibutoxy acetophenone, 2-hydroxy-2-methyl propiophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, and the like, and combinations thereof.

Examples of the thioxanthone-based compound may include without limitation thioxanthone, 2-methyl thioxanthone, isopropyl thioxanthone, 2,4-diethyl thioxanthone, 2,4-diisopropyl thioxanthone, 2-chloro thioxanthone, and the like, and combinations thereof.

The benzoin-based compound may include benzoin, benzoin methyl ether, benzoin ethyl ether, benzoin isopropyl ether, benzoin isobutyl ether, benzyl dimethyl ketal, and the like, and combinations thereof.

Examples of the oxime-based compound may include without limitation 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

Other examples of the photopolymerization initiator may include without limitation carbazole-based compounds, diketone-based compounds, sulfonium borate-based compounds, diazo-based compounds, biimidazole-based compounds, and the like, and combinations thereof, other than or in addition to the above photopolymerization initiators.

The photosensitive resin composition may include the photopolymerization initiator in an amount of about 0.1 to about 10 wt % based on the total weight of the photosensitive resin composition. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of photopolymerization initiator can be in a range from about any of the foregoing amounts to about any other of the foregoing amounts.

When the photosensitive resin composition includes the photopolymerization initiator in an amount within the above range, it may cause sufficient photopolymerization during the pattern forming process when exposed to light. In addition, unreacted initiator left after the photopolymerization may not deteriorate transmittance.

(E) Solvent

Examples of the solvent may include without limitation ethylene glycol acetate, ethyl cellosolve, ethyl ethoxy propionate, ethyl lactate, polyethylene glycol, and the like, and combinations thereof. Other examples of the solvent may also include without limitation ethylene glycol compounds such as ethylene glycol, diethylene glycol, and the like; glycol ether compounds such as ethylene glycol monomethylether, diethylene glycol monomethylether, ethylene glycol diethylether, diethylene glycol dimethylether, and the like; glycol ether acetate compounds such as ethylene glycol monoethylether acetate, diethylene glycol monoethylether acetate, diethylene glycol monobutylether acetate, and the like; propylene glycol; propylene glycol ether compounds such as propylene glycol monomethylether, propylene glycol monoethylether, propylene glycol monopropylether, propylene glycol monobutylether, propylene glycol dimethylether, dipropylene glycol dimethylether, propylene glycol diethylether, dipropylene glycol diethylether, and the like; propylene glycol ether acetate compounds such as propylene glycol monomethylether acetate, dipropylene glycol monoethylether acetate, and the like; amide compounds such as N-methyl pyrrolidone, dimethyl formamide, dimethyl acetamide, and the like; ketone compounds such as methyl ethyl ketone (MEK), methyl isobutyl ketone (MIBK), cyclohexanone, and the like; petroleum compounds such as toluene, xylene, solvent naphtha, and the like; and ester compounds such as ethyl acetate, butyl acetate, ethyl lactate, and the like. These solvents may be used singularly or in combination of two or more.

The photosensitive resin composition may include the solvent in a balance amount, for example in an amount of about 20 to about 90 wt % based on the total weight of the photosensitive resin composition. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have excellent coating properties. In addition, it can maintain flatness when it is coated to be 1 μm thick or more.

(F) Other Additives

The photosensitive resin composition for a color filter may further include one or more additives. For example, the photosensitive resin composition may include a dispersing agent in order to uniformly disperse the (A) to (D) components in the solvent (E) as mentioned above.

The photosensitive resin composition may include other additives such as but not limited to malonic acid, 3-amino-1, 2-propanediol, silane-based coupling agents including a vinyl group and/or a (meth)acryloxy group, leveling agents, fluorine-based surfactants, radical polymerization initiators, and the like, and combinations thereof, in order, for example, to prevent staining or spotting during coating and/or generation of a residue due to non-development and/or to control leveling. These additives may be included in an adjusted amount depending on desired properties.

The photosensitive resin composition for a color filter according to one embodiment can be coated to be 3.1 to 3.4 μm thick on a bare glass substrate or a substrate coated with 500 Å to 1500 Å-thick $SiN_x$ (a protective layer) thereon using spin coating, slit coating, and the like. After the coating, the coated substrate can be radiated by light to form a pattern required for a color filter. When the coating layer is treated with an alkali development solution to dissolve the non-radiated part, a pattern for a color filter is formed. This process can be repeated as many times as the number of colors of R, G, and B to acquire a color filter with a desired pattern. In this process, the developed image pattern may be heated or cured by actinic rays to improve crack resistance, solvent resistance, and the like.

In general, since a negative photosensitive resin is not easily stripped by an organic solvent, its residue may contaminate a lower layer. In addition, the negative photosensitive resin has a weaker close contacting property (adhesion) with a lower layer than a positive photosensitive resin, increasing undercut thereof. According to one embodiment of the present invention, a photosensitive resin composition for a color filter may improve stripper resistance of such a negative photosensitive resin, prevent contamination of a lower layer, and improve the close contacting property with a lower layer.

The following examples illustrate the present invention in more detail. However, it is understood that the present invention is not limited by these examples.

Preparation of Photosensitive Resin Composition

Example 1

(A) Dye 3.4 g of a dye represented by the following Chemical Formula 2 (A-1, CF Yellow 100108, Kyung-In Synthetic Corporation)

[Chemical Formula 2]

(A'-1) Red Pigment Dispersion 18.36 g of CHR50-R254 (14.75% of a pigment solid, Mikuni Corp.)

2.24 g of CHR50-R254 (12.88% of a pigment solid, Mikuni Corp.)

(B) Acrylic-Based Binder Resin 5.0 g of methacrylic acid/benzylmethacrylate (30/70 (w/w), molecular weight (Mw)=28,000)

(C) Acrylic-Based Photopolymerizable Monomer 12.3 g of dipentaerythritol hexaacrylate (D) Photopolymerization Initiator 2.0 g of an oxime-based photopolymerization initiator (CGI-124, Ciba Specialty Chemicals Corp.)

(E) Solvent 33.8 g of propylene glycol monomethylether acetate 12.7 g of ethyl-3-ethoxy propionate (F) Surfactant 0.2 g of a fluorine-based surfactant (F-482, DIC Inc.)

2.0 g of the photopolymerization initiator (D) is dissolved in 33.8 g of propylene glycol monomethylether acetate and 12.7 g of ethyl-3-ethoxy propionate (EEP) as the solvent (E). The solution is agitated at room temperature for two hours. Then, 3.4 g of a dye (A-1) represented by the above Chemical Formula 2 is dissolved in cyclohexanone to be 10 wt %. The solution is added to the above product, and 5.0 g of the acrylic-based binder resin (B) and 12.3 g of the acrylic-based photopolymerizable monomer (C) are added thereto. The mixture is agitated at room temperature for two hours. 20.6 g of the red pigment dispersion (A'-1) is added to the agitated product. The resulting mixture is agitated at room temperature for one hour, and 0.2 g of the surfactant (F) was added thereto. The mixture is agitated at room temperature for one hour. The solution is filtered three times to remove impurities, preparing a photosensitive resin composition.

Example 2

(A) Dye
2.38 g of a dye represented by the above Chemical Formula 2 (A-1) (CF Yellow 100108, Kyung-In Synthetic Corporation)
(A'-1) Red Pigment Dispersion
30.6 g of C.I. pigment red 254/C.I. pigment red 177 (mixing weight ratio of 60/40, a solid of 4.9 g)
(A'-2) Yellow Pigment
1.02 g of C.I. pigment yellow 150
(B) Acrylic-Based Binder Resin
5.0 g of an acrylic acid/benzylmethacrylate copolymer (Miwon Commercial Co., Ltd, NPR1520)
(C) Acrylic-Based Photopolymerizable Monomer
12.3 g of dipentaerythritol hexaacrylate
(D) Photopolymerization Initiator
2.0 g of an oxime-based photopolymerization initiator (CGI-124)
(E) Solvent
33.8 g of propylene glycol monomethylether acetate
12.7 g of ethyl-3-ethoxy propionate
(F) Surfactant
0.2 g of a fluorine-based surfactant (F-482, DIC Inc.)
2.0 g of the photopolymerization initiator (D) is dissolved in 33.8 g of propylene glycol monomethylether acetate and 12.7 g of ethyl-3-ethoxy propionate (EEP) as the solvent (E). The solution is agitated at room temperature for 2 hours. Next, 2.38 g of a dye (A-1) represented by the above Chemical Formula 2 is dissolved to be 10 wt % in cyclohexanone. This solution is added to the above agitated solution, and 5.0 g of the acrylic-based binder resin (B) and 12.3 g of the acrylic-based photopolymerizable monomer (C) are added thereto. The mixture is agitated at room temperature for 2 hours. The solution is filtered three times to remove impurities, preparing a photosensitive resin composition. Then, 30.6 g of the red pigment dispersion (A'-1) and 1.02 g of the yellow pigment (A'-2) are added to the photosensitive resin composition. The mixture is agitated at room temperature for one hour, and 0.2 g of the surfactant (F) is added thereto. The resulting mixture is agitated at room temperature for one hour. The solution is filtered three times to remove impurities, preparing a photosensitive resin composition.

Example 3

A photosensitive resin composition is prepared according to the same method as in Example 2, except for using 2.38 g of the dye (A-1) instead of 2.04 g of the dye (A-1) and 1.36 g of the yellow pigment (A'-2) instead of 1.02 g of the yellow pigment (A'-2).

Example 4

A photosensitive resin composition is prepared according to the same method as Example 2, except for using 1.7 g of the dye (A-1) instead of 2.38 g of the dye (A-1) and 1.7 g of the yellow pigment (A'-2) instead of 1.02 g of the yellow pigment (A'-2).

Example 5

A photosensitive resin composition is prepared according to the same method as in Example 2, except for using 1.36 g of the dye (A-1) instead of 2.38 g of the dye (A-1) and 2.04 g of the yellow pigment (A'-2) instead of 1.02 g of the yellow pigment (A'-2).

Example 6

A photosensitive resin composition is prepared according to the same method as in Example 2, except for using 1.2 g of the dye (A-1) instead of 2.38 g of the dye (A-1) and 2.38 g of the yellow pigment (A'-2) instead of 1.02 g of the yellow pigment (A'-2).

Comparative Example 1

A photosensitive resin composition is prepared according to the same method as in Example 1, except for using 3.4 g of the yellow pigment (A'-2) instead of the dye (A-1).

Comparative Example 2

Preparation of Photosensitive Resin Composition

A photosensitive resin composition is prepared according to the same method as in Example 1, except for using 3.4 g of a dye (A-2) represented by the following Chemical Formula 3 instead of the dye (A-1).

[Chemical Formula 3]

Comparative Example 3

A photosensitive resin composition is prepared according to the same method as in Example 1, except for using 3.4 g of a C.I yellow dye 82 (A-3) instead of the dye (A-1).

Pattern Formation of a Photosensitive Resin Composition

The photosensitive resin compositions according to Examples 1 to 6 and Comparative Examples 1 to 3 are respectively coated on a 10×10 cm$^2$ glass substrate using a spin-coater (K-Spin8, KDNS) and prebaked at 90° C. for 3 minutes. The baked product is cooled down under an air atmosphere and exposed to light in an amount of 100 mJ/cm² (based on 365 nm) using an exposer (I10C, Nikon Inc.), forming a thin film. After the exposure, the thin film is post-baked at 230° C. for 30 minutes with a hot air drier.

Experimental Example 1

The diaminopyridine azo-based dyes (A-1) according to Examples 1 to 6 are measured regarding various properties such as solubility, maximum absorption wavelength, thermal decomposition temperature, and the like.

Figure 1:
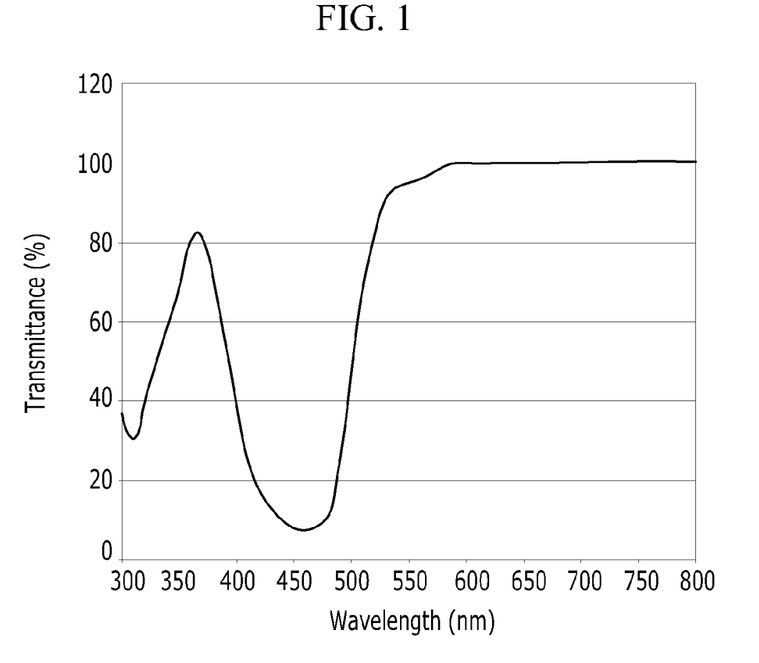
FIG. 1 is a spectrum transmittance graph showing a diaminopyridine azo-based dye (A-1) according to Examples 1 to 6.
Figure 2:
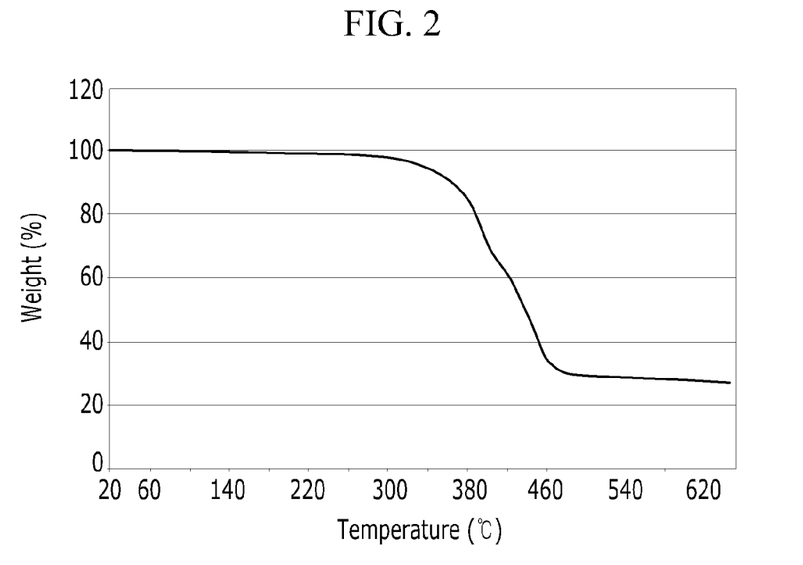
FIG. 2 is a graph showing the thermogravimetric analysis (TGA) result of a diaminopyridine azo-based dye (A-1) according to Examples 1 to 6.

FIG. 1 is a graph showing the spectrum transmittance graph of the diaminopyridine azo-based dye (A-1), and FIG. 2 is a graph showing thermogravimetric analysis (TGA) results.

Referring to FIGS. 1 and 2, the dyes (A-1) according to Examples 1 to 6 has a solubility of 10 in cyclohexanone, a maximum absorption wavelength of 470 nm, and a thermal decomposition temperature of 318° C., at which 10% of their weight are decomposed.

Experimental Example 2

Spectrum Evaluation of Photosensitive Resin Composition

The cured films prepared using the photosensitive resin compositions are measured regarding color coordinate (x and y) and luminance (Y) by using a spectrophotometer (MCPD 3000, Otsuka Electronics Co., Ltd.) and regarding contrast ratios by using a contrast ratio-measuring device (CT-1, 20,000:1, Tsubosaka Electronic Co., Ltd.).

Storage/Dispersion Stability Evaluation

Each photosensitive resin composition according to Examples 1 to 6 and Comparative Examples 1 to 3 is stored at 40° C. for one week and measured regarding viscosity change by using a viscometer (DV-III+Rheometer, Brookfield Inc.).

The results are classified as follows, and are provided in the following Table 1.

⊚: no viscosity change, no foreign particle appearance in a photosensitive resin composition ○: viscosity change ranging from 0.1 to 0.5 cPs, no foreign particles Δ: viscosity change ranging from 0.5 to 1.0 cPs, no foreign particles x: obvious viscosity of more than 1.0 cPs or foreign particles due to recrystallization and the like Light Resistance Evaluation The cured films prepared by using the photosensitive resin compositions are evaluated regarding light resistance, and also color difference before and after the photo-radiation. The light resistance is measured by using a Xenon test chamber (XE-1-S, Q-Sun Xenon Test Chamber) made by Q-lab Co. The color difference is measured by a colorimeter (MCPD 3000, Otsuka Electronics Co. Ltd.). The results are classified as follows, and are provided in the following Table 1.

⊚: no color difference (ΔEab*) after photo-radiation,

○: 1.0<ΔEab*<3.0 after treatment for one hour

Δ: 3.0<ΔEab*<5.0, ΔE<3.0 after treatment for one hour x: a color difference clearly recognized with the naked eye, ΔE>3.0 after treatment for one hour Heat Resistance Evaluation The photosensitive resin compositions according to Examples 1 to 6 and Comparative Examples 1 to 3 are evaluated regarding heat resistance against a peeler solution.

The photosensitive resin compositions according to Examples 1 to 6 and Comparative Examples 1 to 3 are respectively coated to be 3 μm thick on a transparent circular glass substrate (a bare glass) or a glass substrate coated with 500 Å-thick silicon nitride ($SiN_x$) by using a spin-coater K-Spin8, KDNS).

The coated substrates are soft-baked on a hotplate at 80° C. for 150 seconds, exposed to a light with an exposer (I10C, Nikon Inc.), and developed at 25° C. for 60 seconds with a developer. The resulting products are washed for 60 seconds and spin-dried for 25 seconds. Herein, the development is performed using a potassium hydroxide aqueous solution with a concentration of 1 wt %. Then, the resulting product is hard-baked in a 230° C. oven for one minute and measured regarding its color, and then hard-baked again in a 230° C. oven for two hours and measured regarding its color by using a spectrophotometer (MCPD3000, Otsuka Electronics Co., Ltd.)

The results are classified as follows, and are provided in the following Table 1.

⊚: no color change or a color change (ΔEab*) of less than 1.0 after treatment for one hour ○: 1.0<ΔEab*<3.0 after treatment for one hour Δ: 3.0<ΔEab*<5.0, ΔE<3.0 after treatment for one hour x: a color change clearly recognized with the naked eye, ΔE>3.0 after treatment for one hour Chemical Resistance Evaluation The photosensitive resin compositions according to Examples 1 to 6 and Comparative Examples 1 to 3 are evaluated regarding stability against an organic solvent by using the four following solvents of N-methyl-2-pyrrolidone (NMP), γ-butyrolactone (GBL), a mixture of methyl beta-methoxy propionate, (MMP)/ethyl-3-ethoxy propionate (EEP), and a mixture of propylene glycol monomethyl ether acetate (PGMEA)/EEP, while they are fabricated into a color film. The chemical resistance test against NMP is performed at room temperature for 30 minutes by dipping films in an NMP solvent. The chemical resistance against GBL is evaluated by dipping films at room temperature for 30 minutes. The chemical resistance against an MMP/EEP and PGMEA/EEP mixed solvent is performed by dipping films therein at 80° C. for 10 minutes. Eab* of the specimens is calculated by using a color difference before and after dipping films in a solvent. The results are classified as follows, and are provided in the following Table 2.

⊚: no color difference (ΔEab*) after photo-radiation

○: 1.0<ΔEab*<3.0 after one hour of photo-radiation

Δ: 3.0<ΔEab*<5.0, ΔE<3.0 after one hour of photo-radiation x: a color difference clearly recognized with the naked eye, ΔE>3.0 after one hour of photo-radiation

TABLE 1

| | Color coordinate | | Luminance | Contrast | Storage/ dispersion | Light | Heat | Chemical |
|---|---|---|---|---|---|---|---|---|
| | x | Y | Y | ratio | stability | resistance | resistance | resistance |
| Ex. 1 | 0.651 | 0.331 | 19.8 | 13,000 | ⊚ | ○ | ○ | ○ |
| Ex. 2 | 0.651 | 0.330 | 19.6 | 12,900 | ⊚ | ○ | ○ | ○ |

TABLE 1-continued

| | Color coordinate | | Luminance | Contrast ratio | Storage/dispersion stability | Light resistance | Heat resistance | Chemical resistance |
|---|---|---|---|---|---|---|---|---|
| | x | Y | Y | | | | | |
| Ex. 3 | 0.651 | 0.330 | 19.4 | 12,800 | ◎ | ○ | ○ | ○ |
| Ex. 4 | 0.651 | 0.329 | 19.3 | 12,400 | ◎ | ○ | ○ | ○ |
| Ex. 5 | 0.651 | 0.328 | 19.0 | 12,500 | ◎ | ○ | ○ | ○ |
| Ex. 6 | 0.651 | 0.328 | 18.7 | 12,500 | ◎ | ○ | ○ | ○ |
| Comp. Ex. 1 | 0.651 | 0.330 | 18.2 | 11,000 | ◎ | ○ | ○ | ○ |
| Comp. Ex. 2 | 0.651 | 0.330 | 18.4 | 11,900 | ◎ | ○ | ○ | ○ |
| Comp. Ex. 3 | 0.651 | 0.328 | 18.7 | 12,400 | ◎ | Δ | X | X |

Referring to Table 1, the photosensitive resin compositions according to Examples 1 to 6 have excellent luminance and contrast ratios in the same x coordinate, and in particular, luminance increasing in proportion to the used amount of a dye (A-1) represented by Chemical Formula 2 compared with the photosensitive resin compositions according to Comparative Examples 1 and 2. The luminance is improved because a dye used in an exemplary embodiment of the present invention had high transmittance in an ultraviolet (UV) region ranging from 500 to 800 nm, and in addition, had a high absorption characteristic in an ultraviolet (UV) region ranging from 450 to 550 nm. In addition, the contrast ratio is improved because a dye (A-1) represented by the above Chemical Formula 2 is soluble in an organic solvent and thus has no particles or has small particles and decreases unnecessary light scattering in the photosensitive resin composition, unlike dispersed particles of a pigment.

In addition, the photosensitive resin composition according to Comparative Example 3 has improved luminance and contrast ratio but deteriorated reliability in terms of light resistance, heat resistance, chemical resistance, and the like. However, the photosensitive resin compositions according to Examples 1 to 6 have light, heat, and chemical resistance within a range of $1.0 < \Delta Eab^* < 3.0$. Accordingly, a photosensitive resin composition including a yellow dye according to one embodiment of the present invention has excellent reliability.

Furthermore, a photosensitive resin composition including a diaminopyridine azo dye (A-1) represented by Chemical Formula 1 according to one embodiment of the present invention has high luminance and contrast ratios compared with the photosensitive resin composition including a conventional diaminopyridine azo dye according to Comparative Example 2.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

That which is claimed is:

1. A photosensitive resin composition for a color filter, comprising:
(A) a colorant including a diaminopyridine azo-based dye including a structure represented by the following Chemical Formula 1 and having an absorption wavelength at about 450 nm to about 550 nm;
(B) an acrylic-based binder resin;
(C) an acrylic-based photopolymerizable monomer;
(D) a photopolymerization initiator; and
(E) a solvent:

[Chemical Formula 1]

wherein, in Chemical Formula 1,
$R^1$ is C2 to C20 alkylamino alkylsulfonyl,
$R^2$ is substituted or unsubstituted C6 to C30 arylene or substituted or unsubstituted C6 to C30 heteroarylene,
$R^3$ is hydrogen, substituted or unsubstituted C1 to C20 alkyl, C1 to C20 alkyl wherein at least one —$CH_2$— is replaced with —$SO_2$—, —O—, or —NR—, wherein R is hydrogen or C1 to C6 alkyl, substituted or unsubstituted C3 to C20 cycloalkyl, substituted or unsubstituted C2 to C20 alkenyl, substituted or unsubstituted C6 to C30 aryl, substituted or unsubstituted C2 to C30 heterocyclic group, sulfonyl alkyl —$SO_2R'$, wherein R' is hydrogen or C1 to C10 alkyl, a sulfonyl aryl —$SO_2R''$, wherein R" is C6 to C16 aryl, an acylic group, a carboxyl group, a sulfone group, or a carbamoyl group,
$R^4$, $R^5$, $R'^4$, and $R'^5$ are the same or different and are each independently hydrogen, substituted or unsubstituted C1 to C20 alkyl, C1 to C20 alkyl wherein at least one —$CH_2$— is replaced with —$SO_2$— or —O—, substituted or unsubstituted C3 to C20 cycloalkyl, substituted or unsubstituted C2 to C20 alkenyl, substituted or unsubstituted C6 to C30 aryl, substituted or unsubstituted C2 to C30 heterocyclic group, sulfonyl alkyl —$SO_2R'$, wherein R' is hydrogen or C1 to C10 alkyl, sulfonyl aryl —$SO_2R''$, wherein R" is C6 to C16 aryl, an acylic group, a carboxyl group, a sulfone group, or a carbamoyl group, wherein substituted alkyl of $R^4$, $R^5$, $R'^4$, and $R'^5$ is alkyl substituted with a substituent selected from the group consisting of halogen, a cyano group, an imino group, an amidino group, a hydrazine group, a hydrazone group, a carboxyl group, substituted or unsubstituted C1 to C20 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, and combinations thereof, and $R^6$ is hydrogen, halogen, or cyano.

2. The photosensitive resin composition for a color filter of claim 1, comprising:
   - about 1 wt % to about 30 wt % of the colorant (A);
   - about 1 wt % to about 30 wt % of the acrylic-based binder resin (B);
   - about 1 wt % to about 20 wt % of the acrylic-based photopolymerizable monomer (C);
   - about 0.1 wt % to about 10 wt % of the photopolymerization initiator (D); and
   - a balance amount of the solvent (E).

3. The photosensitive resin composition for a color filter of claim 1, wherein the dye has transmittance of about 95% to about 100% in a long wavelength region of about 500 nm to about 800 nm.

4. The photosensitive resin composition for a color filter of claim 1, wherein the dye has a thermal decomposition temperature (Td10%) of about 280° C. to about 400° C. at which about 10 wt % of the dye is thermally decomposed.

5. The photosensitive resin composition for a color filter of claim 1, wherein the dye has ΔEab* of less than 3.

6. The photosensitive resin composition for a color filter of claim 1, wherein the photosensitive resin composition further comprises a pigment, and the diaminopyridine azo-based dye of the above Chemical Formula 1 and the pigment are included in a mixing weight ratio of about 7:3 to about 3:7.

7. The photosensitive resin composition for a color filter of claim 1, wherein the photosensitive resin composition further comprises a dispersing agent; malonic acid; 3-amino-1,2-propanediol; a silane-based coupling agent including a vinyl group or a (meth)acryloxy group; a leveling agent; a fluorine-based surfactant; a radical polymerization initiator, or a mixture thereof.

8. A color filter manufactured using the photosensitive resin composition for a color filter according to claim 1.

* * * * *